United States Patent [19]

Murakami et al.

[11] Patent Number: 4,552,434
[45] Date of Patent: Nov. 12, 1985

[54] CRYSTALLINE INFRARED OPTICAL FIBER WITH A SMALL GAP AND A PROCESS FOR THE PRODUCTION OF SAME

[75] Inventors: Kazuhito Murakami; Kenichi Takahashi, both of Osaka, Japan

[73] Assignee: Sumitomo Electric Industries, Ltd., Osaka, Japan

[21] Appl. No.: 474,350

[22] Filed: Mar. 11, 1983

[30] Foreign Application Priority Data

Mar. 16, 1982 [JP] Japan .................. 57-40254
Mar. 16, 1982 [JP] Japan .................. 57-40255
Mar. 16, 1982 [JP] Japan .................. 57-40256

[51] Int. Cl.$^4$ .................................. G02B 5/14
[52] U.S. Cl. .................. 350/96.30; 350/96.29; 350/96.33; 350/96.34; 65/2; 65/3.1; 65/3.11; 65/3.2; 427/160; 427/162
[58] Field of Search ............. 350/96.10, 96.29, 96.30, 350/96.33, 96.34; 250/227; 65/1, 2, 3.1, 3.11, 3.2, 3.3, 3.4; 427/160, 162

[56] References Cited

U.S. PATENT DOCUMENTS

| | | | |
|---|---|---|---|
| 3,227,032 | 1/1966 | Upton | 350/96.29 |
| 3,253,896 | 5/1966 | Woodcock et al. | 350/96.29 |
| 4,039,607 | 8/1977 | Miller | 65/3.11 |
| 4,165,915 | 8/1979 | Rau et al. | 350/96.3 |
| 4,253,731 | 3/1981 | Anderson et al. | 350/96.3 |
| 4,326,869 | 4/1982 | Kurosaki et al. | 65/3.11 |
| 4,375,314 | 3/1983 | Sakuragi et al. | 350/96.29 |
| 4,381,141 | 4/1983 | Sakuragi et al. | 350/96.29 |
| 4,451,116 | 5/1984 | Pinnow et al. | 350/96.29 |
| 4,480,898 | 11/1984 | Taylor | 350/96.30 |

FOREIGN PATENT DOCUMENTS 53-145645 12/1978 Japan ............... 350/96.30
54-143242 11/1979 Japan ............... 350/96.30

OTHER PUBLICATIONS

Mitachi et al., "Teflon Fed-Clad ... Fibre", Electronics Lett., 2/81, vol. 17, No. 3, pp. 128–129.

Primary Examiner—William L. Sikes
Assistant Examiner—Brian M. Healy
Attorney, Agent, or Firm—Wenderoth, Lind & Ponack

[57] ABSTRACT

An infrared fiber is obtained in which a core crystal fiber for transmitting infrared rays is inserted in a cladding crystal pipe having a smaller refractive index than the core crystal fiber and in which the interface between the core and pipe is held smooth. This infrared fiber can effectively be prepared by inserting a core crystal fiber in a cladding crystal pipe and then subjecting the inserted pipe to a drawing working through a die.

14 Claims, 13 Drawing Figures

(a)

(b)

CRYSTALLINE INFRARED OPTICAL FIBER WITH A SMALL GAP AND A PROCESS FOR THE PRODUCTION OF SAME

BACKGROUND OF THE INVENTION

1. Field of the Invention

This invention relates to infrared fibers and more particularly, it is concerned with infrared transmitting fibers consisting of crystalline metal halides and an improved process for the production of the same.

2. Description of the Prior Art

Various efforts have hitherto been made to prepare infrared fibers by processing optical crystals as described in "Nikkei Electronics" Dec. 8, 1980, page 140.

Above all, to guide light in a fiber, there have been proposed (1) a fiber structure of loose clad type as disclosed in Japanese Patent Application OPI (Kokai) No. 145645/1978, in which an extruded fiber is loosely inserted in a tube, the crystalline fiber being used as a core and air being used as a cladding and (2) a fiber structure of step index type as disclosed in Japanese Patent Application OPI (Kokai) No. 143242/1979, in which the circumference of a core crystal under molten state is coated with a glass with a large viscosity and subjected to spinning to form a fiber clad with the glass. In addition, U.S. Pat. No. 4253731 describes a fiber structure (3) of step index type prepared by extruding simultaneously a core crystal and a cladding crystal.

The above described infrared fiber (1) is prepared as follows. Firstly, a core crystalline fiber is prepared by means of an apparatus as shown in FIG. 1. That is to say, core crystal 1 for extrusion billet is charged in extruding container 3 provided with die 4, extruding ram 6 and die holder 5. Core crystal 1 is heated at a predetermined temperature by heater 7 and then extruding ram 6 is pressed by a hydraulic press to form core crystal fiber 2. The thus formed core crystal fiber 2 is loosely inserted in polymer pipe 8 as shown in FIG. 2, (a) of FIG. 2 being a cross sectional view and (b) being a longitudinal sectional view. Polymers such as teflon are not suitable for transmission of a large input laser beam because of a large absorption loss of infrared rays resulting in a large loss at the contact area of the fiber and polymer pipe.

The structure (2) is mechanically weak due to the difference in thermal expansion between the crystalline core material and glassy cladding material, resulting in strain in the fiber. Moreover, many glassy materials are not suitable for the transmission of infrared rays of long wavelengths and produce a large transmission loss as a cladding layer of an infrared fiber. Thus, selection of a suitable cladding material is considerably restricted.

In the case of (3), the method of coating a core crystal with a cladding crystal comprising extruding simultaneously the core crystal, and cladding crystal has the disadvantage that it is difficult to obtain a fiber with a smaller diameter by processing the core to a great extent in a circular form because the interface between the core and cladding tends to be disordered.

SUMMARY OF THE INVENTION

It is an object of the present invention to provide an infrared fiber consisting of metal halides.

It is another object of the present invention to provide an infrared fiber having mechanically and optically stable performances.

It is a further object of the present invention to provide an infrared fiber with a decreased disorder in the interface between the core and cladding and a decreased transmission loss.

It is a still further object of the present invention to provide an improved process for the production of an infrared fiber by pipe drawing using a die.

These objects can be attained by a crystalline fiber in which a core crystalline fiber for transmitting infrared rays is provided in a pipe of cladding crystal with a smaller refractive index than the core crystal.

BRIEF DESCRIPTION OF THE DRAWINGS

The accompanying drawings illustrate the principle and merits of the present invention in greater detail.

DETAILED DESCRIPTION OF THE INVENTION

Figure 1:
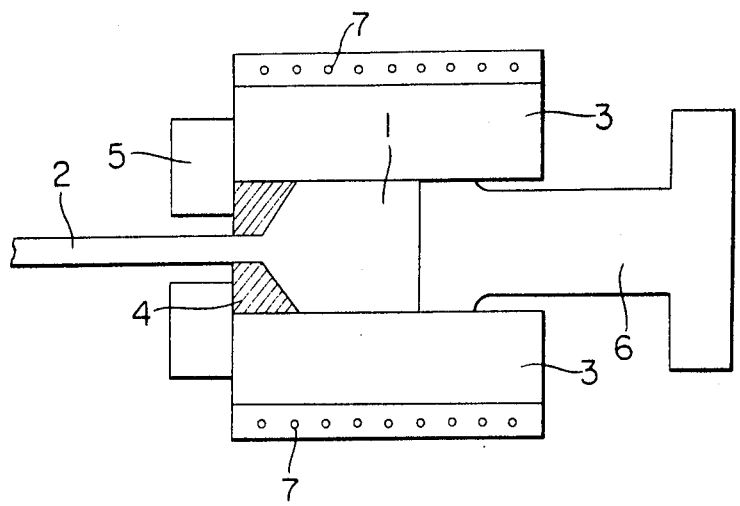
FIG. 1 is a schematic view of an apparatus for extruding a core crystalline fiber.
Figure 2:
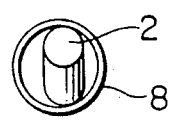
FIGS. 2(a) and (b) are respectively a cross-sectional view and longitudinally sectional view of the prior art infrared fiber.
Figure 2:
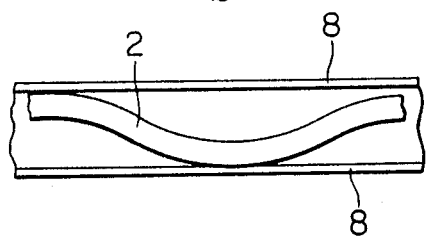

We, the inventors, have made efforts to obtain an improved infrared fiber excellent in mechanical and optical performances, whereby the above described disadvantages can be overcome, and consequently, have reached the present invention.

That is to say, the present invention provides an infrared fiber having a structure characterized in that a core crystalline fiber for transmitting infrared rays is inserted in a tubular crystal having a smaller refractive index than the core crystal, and this infrared fiber is prepared, for example, by making a core crystal fiber, inserting the core crystal fiber in a cladding crystal pipe and subjecting them to pipe drawing through a die to thus coat the core crystal fiber with the cladding crystal. The resulting infrared fiber has a decreased disorder in the interface between the core and cladding and a low transmission loss. In a preferred embodiment of the present invention, a core crystalline fiber is inserted in a cladding crystalline pipe with a gap of at most 0.1 mm, preferably 0.01 to 0.1 mm. If the gap between the core crystalline fiber and cladding crystalline pipe is more than 0.1 mm, the effect of the cladding pipe is little, but if the gap is 0.1 mm or less, there is a tendency of lowering of the transmission loss. Even if the pipe drawing is further carried out to decrease the gap and the gap is less than 0.01 mm, the transmission loss can be held small as far as the interface between the core and cladding is held smooth. However, when the gap is less than 0.01 mm, the core surface tends to be scratched and accordingly, handling must be effected with great care. Thus, a gap of 0.01 mm or more is preferable from the standpoint of making an infrared fiber without such great care.

As materials for the core crystal fiber and cladding crystal pipe, there are used optical crystals of metal halides, for example, thallium halides such as KRS-5, KRS-6, TlBr and TlCl, silver halides such as AgCl, and AgBr, alkali metal halides such as CsBr and CsI, and mixed crystals thereof, from which suitable combinations of the core crystal and cladding crystal are chosen, the former having a larger refractive index than the cladding crystal in the infrared range.

Examples of the combination of the core crystal fiber and cladding crystal pipe are shown in the following table in which each possible combination is connected by a line:

| | Core | | Cladding |
|---|---|---|---|
| Alkali Halide | Cesium Iodide | ——— | Cesium Bromide |
| Silver Halide | Silver Bromide | | Silver Chloride |
| | Mixed Crystal | | Mixed Crystal |
| | Silver Bromide + 0.01–10 wt % Silver Chloride | | Silver Chloride + 0.01–10 wt % Silver Bromide |
| Thallium Halide | Thallium Bromide | | Thallium Chloride |
| | | | KRS-6** |
| | KRS-5* | | Thallium Bromide |

*KRS-5: mixed crystal of thallium iodide (45.7 mol %) and thallium bromide (54.3 mol %)
**KRS-6: mixed crystal of thallium bromide (29.8 mol %) and thallium chloride (70.2 mol %)

Figure 3:
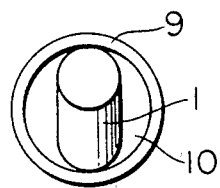
FIG. 3 and FIG. 4 are cross-sectional views of crystalline fibers as embodiments of the present invention.
Figure 4:
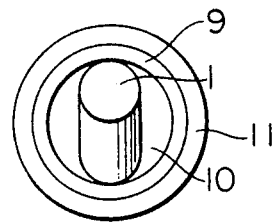

The cross-sectional view of the crystalline fiber of the present invention is shown in FIG. 3, which comprises core crystal fiber 1 for transmitting infrared rays, cladding crystal pipe 9 having a smaller refractive index than the core crystal, and gap 10 between them. If necessary, the crystalline fiber of the present invention can further be coated with protective monolayer or multilayer 11 of a resin or metal to protect the fiber against breakage or deformation due to an external force or from adhesion of dust as shown in FIG. 4. For example, lead, lead-tin alloys, aluminum and silver are used as the metal and coated by extrusion. As the resin, there are used ABS resins, polybutadiene, polypropylene, polyethylene, polycarbonate, polyvinyl chloride, polyphenylene oxide, polysulfone and mixtures thereof, which are generally coated by melt extrusion, and polyesterimides, polyesters, polyurethanes, polyols, polyimide, polyamideimides, silicone resins, tetrafluoro resins, epoxy resins and mixtures thereof, which are generally coated by applying and baking.

The above described core crystal fiber of the crystalline fiber is generally prepared in known manner, for example, by extrusion molding.

The cladding crystal pipe is generally prepared by extrusion with the combination die system or with the mandrel system, but in view of the strength and maintenance of a mandrel and the preparation of a small diameter pipe, the former system is preferable.

Figure 5:
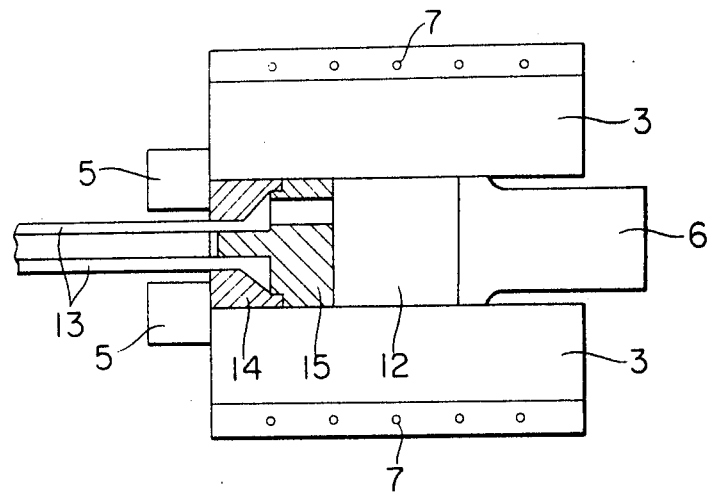
FIG. 5 is a schematic view of an extrusion apparatus of combination type, used for making a cladding crystalline pipe in the crystalline fiber according to the present invention.

FIG. 5 shows a method of preparing a cladding crystal pipe by the extrusion molding of the combination die system, which comprises charging billet 12 of optical crystal for a cladding crystal pipe in an extrusion container 3 provided with die 14, porthole 15, extrusion ram 6 and die holder 5, heating billet 12 by heater 7 and when it reaches a predetermined temperature, pressing extrusion ram 6 by a hydraulic press to form cladding crystal pipe 13.

Figure 6:
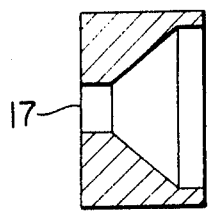
FIG. 6(a) is a cross-sectional view of a combination die (die) 14 in FIG. 5, and FIGS. 6(b) and (c) are respectively a cross-sectional view and side view of a combination die (porthole) 15 in FIG. 5, the cross-sectional view (b) being along chain lines A and B in FIG. 6(c).
Figure 6:
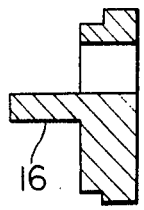
Figure 6:
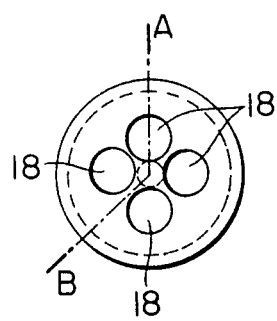

FIG. 6(a) is a cross-sectional view of a combination die (die) 14 and FIGS. 6(b) and (c) are respectively a cross-sectional view and side view of a combination die (porthole) 15, (b) being along chain lines A-B in FIG. 6(c). 16 is a core defining the inner diameter of a pipe and 17 is a die hole defining the outer diameter of a pipe. A cladding crystal is extruded through hole 18 and passed through a gap between the porthole and die to form a tubular structure.

Core crystal fiber 2 is inserted in cladding crystal pipe 13 to give a crystalline fiber as shown in FIG. 3.

The resulting infrared fiber comprising a core crystal fiber inserted in a cladding crystal pipe is superior to the prior art infrared fiber, comprising a core crystal fiber loosely inserted in a polymer pipe such as of teflon mentioned in the foregoing (1), in a transmission loss since in the former, there is little loss at the contact area of the core crystal and cladding crystal.

In order to insert a core crystal fiber in a cladding crystal pipe, it is required to make the diameter of the pipe larger than that of the core. A core crystal fiber can batchwise be inserted in a cladding crystal pipe previously prepared as described above. However, insertion of a core crystal fiber results in a tendency of scratching the surface of the soft core crystal fiber due to friction during the insertion, and increasing the transmission loss. Thus, a core crystal fiber can also be inserted in a pipe simultaneously with preparation of a cladding crystal pipe by extrusion.

Figure 7:
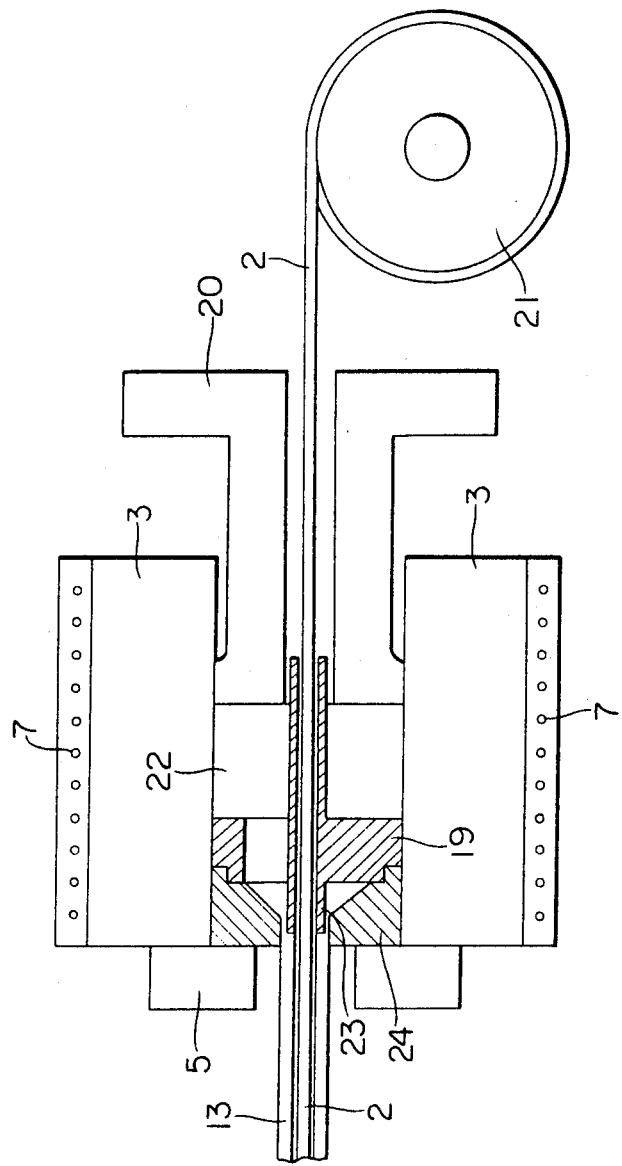
FIG. 7 is a schematic view of an extrusion apparatus for inserting a core crystalline fiber during manufacture of a cladding crystalline pipe according to the present invention.

In FIG. 7, for example, there is shown an apparatus for extruding a clad optic fiber. Previously hold-made cladding crystal 22 for an extrusion billet and combination die (porthole) 19 having guide 23 of for core crystal fiber 2 are combined, charged in extrusion container 3 and extruded to form cladding crystal pipe 13 by means of combination die 24 (die), die holder 5 and extrusion ram 20 having a hole made to pass core crystal fiber 2. The combination die (porthole) is provided with guide 23 consisting of a hollow protective shaft so that the core crystal fiber is not crushed by pressure applied during preparation of the cladding crystal pipe. To this end, the cladding crystal should have a hole larger than the diameter of the guide. After heating at a predetermined temperature by heater 7, core crystal fiber 2 is passed through extrusion ram 20, and combination dies 19 and 24. This core crystal fiber can be prepared by the method as shown in FIG. 1, taken up around reel 21 and then fed, or can be extruded simultaneously with extruding the cladding crystal pipe.

However, the fiber of the structure as shown in FIG. 3 meets with deterioration of the optical and mechanical properties thereof due to etching action of the atmosphere, e.g. moisture in the air, and has the disadvantage that the interior core fiber tends to be broken by an impulse to the pipe as a protective layer or by repeated bending.

A core crystal fiber should thus be coated tightly with a cladding crystal pipe to protect the core crystal fiber, for example, by inserting the core crystal fiber in the cladding crystal pipe and subjecting them to pipe drawing through a die.

Figure 8:
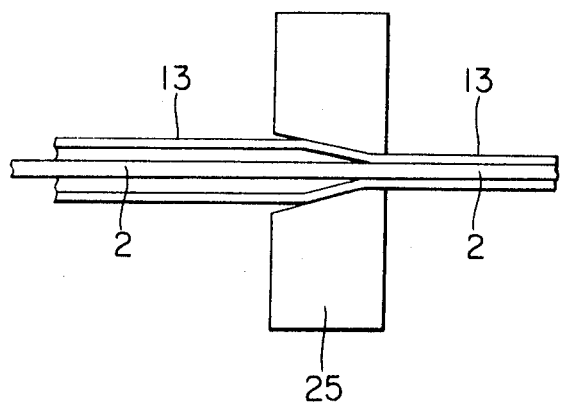
FIG. 8 is a cross-sectional view to illustrate the state of pipe drawing using a die.

FIG. 8 shows schematically the state of drawing a pipe through a die. Core crystal fiber 2 is inserted in cladding crystal pipe 13 and then subjected to working through drawing die 25, during which a lubricating oil is applied to the surface of the cladding crystal pipe uniformly to decrease the friction between the die and pipe and to reduce the drawing force. To insert a core crystal fiber in a cladding crystal pipe, there is a gap between the pipe and fiber and, accordingly, only the cladding crystal pipe is firstly worked in such a range that the pass number of pipe drawing and the work degree are small, the gap being gradually decreased. When the gap is small, for example, in the range of 0.01–0.1 mm, the core crystal fiber is scarcely moved in the cladding crystal pipe and can resist an impulse or bending. During the same time, the pipe drawing can optionally be stopped.

Drawing of a cladding crystal pipe through a die is preferably carried out so as to decrease the deformation resistance of the crystal in such a temperature range that the pipe or fiber is hot- or warm-worked, for example, at 120° to 350° C. in the case of KRS-5, at 100° to 370° C. in the case of AgCl and at 180° to 370° C. in the case of CsI.

Since metal halide crystals have small tensile strengths, it is desired that the reduction of area per one pass of die is adjusted to 20% or less so that the drawing force is not so large during pipe drawing, and preferably 5% or less which hardly causes deformation of a core fiber. That is to say, forcible working of a core crystal fiber and cladding crystal pipe after they are tightly contacted is preferably carried out in such a manner that the area reduction of the core crystal fiber during pipe drawing amounts to 20% or less, considering that a large drawing force is required and the cladding crystal and core crystal are deformed together to roughen the interface between the core and cladding.

Furthermore, in order to decrease the drawing force, it is preferable to use lubricants, in particular, liquid lubricants, for example, mineral oils such as spindle oil, turbine oil and silicone oil, and fatty oils such as palm oil and whale oil. In pipe drawing at a high temperature, heat resisting mineral oils, in particular, silicone oil is preferably used.

Figure 9:
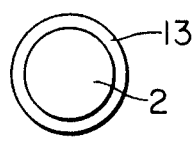
FIGS. 9(a) and (b) are cross-sectional views of infrared fibers of the present invention.
Figure 9:
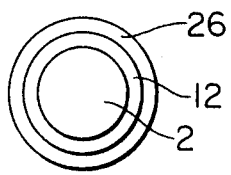

FIG. 9 shows a cross-sectional view of the thus obtained infrared fiber of the present invention, consisting of core crystal 2 and cladding crystal 13.

Because of the structure that infrared rays are enclosed in a core and guided, the outside of a cladding layer can further be coated with a protective monolayer or multilayer of a metal or plastic to reinforce the infrared fiber, as in the case of the ordinary optic fiber. In FIG. 9, 26 is a protective layer.

In the present invention, a cladding crystal pipe can readily be prepared by the use of a combination die in a similar extrusion method to a core crystal fiber, and the core crystal fiber is inserted in the cladding crystal pipe to obtain a crystalline fiber with a decreased loss of infrared rays at the contact area of the core crystal fiber and the cladding crystal pipe.

In addition, according to the present invention, a core crystal fiber can be fed and inserted simultaneously with preparation of a cladding crystal pipe. Therefore, the disadvantage can be overcome that a soft core crystal fiber tends to be scratched, after resulting in an increase in transmission loss, in the case of inserting a core crystal fiber in a cladding crystal fiber. Moreover, there can be obtained the advantage that the length of the fiber to be handled can be made larger than in the batchwise system.

Furthermore, because of the use of a process of coating a core crystal fiber with a cladding crystal pipe comprising inserting the core crystal fiber in the cladding crystal pipe and then subjecting them to drawing through a die according to one preferred embodiment of the present invention, the working conditions, e.g. reduction of area, drawing temperature, selection of a suitable lubricant, etc. can widely be controlled. Therefore, the core crystal fiber and cladding crystal pipe can be held smooth and the interface between the core and cladding can thus be held smooth, thus obtaining an infrared fiber with a decreased disorder in the interface between the core and cladding and a decreased transmission loss. Since the circumference of a core crystal fiber is coated with a cladding crystal layer and infrared rays can be guided through only the core, the outer circumference of the resulting crystalline fiber can closely be coated with a protective layer to increase its resistance to the environment as well as to reinforce it mechanically, and an infrared fiber with a stable mechanical and optical performance can thus be provided.

The infrared fiber of the present invention is available for $CO_2$ or CO laser beam waveguides in laser devices for surgical operation such as a laser scalpel and laser coagulator, or for infrared waveguides, e.g. to be connected with an infrared detector in a remote alarm system.

The following examples are given in order to illustrate the present invention without limiting the same.

EXAMPLE 1

A cylindrical crystal consisting of a high purity mixed crystal of 98% silver bromide and 2% silver chloride was used as an extrusion billet. This billet was charged in a container of an extrusion apparatus and then extruded at a temperature of 100° to 380° C. to form a core crystal fiber with a diameter of 0.5 to 2 mm. On the other hand, a billet consisting of a high purity mixed crystal of 98% silver chloride and 2% silver bromide was used for a cladding crystal pipe, charged in a container of an extrusion apparatus provided with a combination die as shown in FIG. 5 and then extruded under a similar condition to the core crystal fiber to form a cladding crystal pipe with an outer diameter of 1.0 to 2.5 mm (thickness 0.1–0.5 mm).

Using the thus resulting crystalline fiber with a length of 2 m, in which the core crystal fiber of 1 mm in diameter was inserted in the cladding crystal pipe of 1.5 mm in outer diameter (thickness 0.2 mm) with a gap of 0.05 mm, an acrylic resin plate or wood plate was bored or cut by allowing a $CO_2$ gas laser beam with an input of 10 W (wavelength 10.6 $\mu$m) to enter one end of the crystalline fiber and focusing through a converging lens for infrared rays, e.g. zinc selenide lens.

EXAMPLE 2

Example 1 was repeated except using KRS-5 as the core material and thallium bromide as the cladding pipe material and adjusting the extrusion temperature to 120°–350° C., thus obtaining a crystalline fiber with a similar dimension to Example 1.

EXAMPLE 3

Example 1 was repeated except using cesium iodide as the core material and cesium bromide as the cladding pipe material and adjusting the extrusion temperature to 400°-550° C., thus obtaining a crystalline fiber with a similar dimension to Example 1.

EXAMPLE 4

A silver bromide crystal fiber with a diameter of 1 mm was prepared by extrusion, while a silver chloride crystal pipe with an outer diameter of 1.5 mm and inner diameter of 1.2 mm was prepared by extrusion using a combination die as shown in FIG. 5. The silver bromide fiber was inserted in the silver chloride pipe and then subjected to drawing through a drawing die of conical type, made of a cemented carbide, having a half vertical angle of 12 degrees. During the same time, various dies capable of giving an area reduction of 5, 10, 15, 20 and 25% per one pass were used. As a result of these drawing tests, it was found that the larger the reduction of area, the larger the drawing force. When the reduction of area was less than 20%, the drawing was carried out without any trouble to give a fiber with a smooth surface, whose interface between the silver bromide core and silver chloride cladding was found smooth by observation of the cross section through an optical microscope. When the reduction of area was 25%, the surface of the fiber was worse and there was a tendency of breakage of the silver chloride pipe.

After drawings of three passes, there was obtained an infrared fiber with an outer diameter of 1.3 mm and a core diameter of 1.0 mm.

EXAMPLE 5

A cylindrical crystal of high purity silver bromide was used as an extrusion billet, charged in a container, heated, extruded at a temperature of 100° to 380° C. without trouble to form a fiber of silver bromide polycrystal, having a diameter of 0.5 to 2 mm, which was taken up as a core crystal fiber on a reel. On the other hand, a cylindrical crystal of high purity silver chloride for a cladding crystal was prepared in which a hole for a guide of a combination die (porthole) was made. The cladding crystal, combination die and ram were set in an extrusion container and heated. At a predetermined temperature, the core crystal fiber was passed through the holes of the ram and the guide of the combination die. At an extrusion temperature ranging from 100° to 380° C., a silver chloride pipe with an outer diameter of 1.0 to 2.5 mm (thickness 0.1 to 0.5 mm) was extruded, while at the same time, the core fiber was inserted in the pipe as if caught up therein. In addition, the silver chloride pipe was further coated with a protective layer of polyethylene by extrusion.

The thus obtained infrared fiber having a core diameter of 1 mm and a pipe outer diameter of 1.5 mm (thickness 0.2 mm) was cut in a length of 2 m and used for boring or cutting an acrylic resin plate or wood plate by allowing a $CO_2$ gas laser beam with an input of 10 W (wavelength 10.6 μm) to enter one end of the infrared fiber and leave the other end thereof and focusing through a converging lens for infrared rays, e.g. zinc selenide lens.

What is claimed is:

1. A crystalline fiber, which comprises a core crystal fiber for transmitting infrared rays provided in a cladding crystal pipe having a smaller refractive index than the core crystal fiber with a gap of 0.01 to 0.1 mm between the core crystal fiber and the cladding crystal pipe, the core crystal fiber and the cladding crystal pipe being crystalline materials selected from the group consisting of thallium halides, silver halides, alkali metal halides and mixed crystals thereof in such a combination as to give a larger refractive index to the core crystal fiber than the cladding crystal pipe.

2. The crystalline fiber of claim 1, wherein the outer circumference of the cladding crystal pipe is coated with a protective layer of a resin or a metal.

3. The crystalline fiber of claim 1, wherein the cladding crystal pipe is obtained by extruding a single crystal or polycrystal through a combination die.

4. A process for the production of a crystalline fiber, which comprises inserting a core crystal fiber in a cladding crystal pipe, and subjecting the fiber and pipe to drawing through a die to thereby coat the core crystal fiber with the cladding crystal pipe such that a gap of 0.01 to 0.1 mm exists between the core crystal fiber and the cladding crystal pipe.

5. The process of claim 4, wherein the core crystal fiber and the cladding crystal pipe are crystalline materials selected from the group consisting of thallium halides, silver halides, alkali metal halides and mixed crystals thereof in such a combination as to give a larger refractive index to the core crystal fiber than the cladding crystal pipe.

6. The process of claim 4, wherein the cladding crystal pipe is obtained by extruding a single crystal or polycrystal of a metal halide through a combination die.

7. The process of claim 4, wherein the drawing is carried out with an area reduction of at most 20%.

8. The process of claim 4, wherein the drawing is carried out by aid of a lubricant.

9. The process of claim 4, wherein the drawing is carried out at a temperature of 100° to 380° C.

10. A process for the production of a crystalline fiber, which comprises preparing a cladding crystal pipe by extrusion and simultaneously inserting a core crystal fiber in the cladding crystal pipe such that a gap of 0.01 to 0.1 mm exists between the core crystal fiber and the cladding crystal pipe.

11. The process of claim 10, wherein the core crystal fiber and the cladding crystal pipe are crystalline materials selected from the group consisting of thallium halides, silver halides, alkali metal halides and mixed crystals thereof in such a combination as to give a larger refractive index to the core crystal fiber than the cladding crystal pipe.

12. The process of claim 10, wherein the extrusion is carried out by the use of a combination die consisting of a die and a porthole with a hole for the passage of the core crystal fiber and a guide of hollow protective shaft and an extrusion ram with a hole for the passage of the core crystal fiber, the combination die and extrusion ram being provided in an extrusion container.

13. The process of claim 10, wherein the extrusion is carried out at a temperature of 100° to 380° C.

14. The process of claim 10, wherein the core crystal fiber is previously prepared by extrusion.

* * * * *